United States Patent [19]

Weintraub et al.

[11] 4,145,720
[45] Mar. 20, 1979

[54] REMOTE CONTROL

[76] Inventors: Morton Weintraub, 1542 47th St.;
Elliot Waxman, 1825 50th St.;
Bernard Gendelman, 1340 52nd St.,
all of Brooklyn, N.Y. 11219

[21] Appl. No.: 911,162

[22] Filed: May 19, 1978

Related U.S. Application Data

[63] Continuation of Ser. No. 707,855, Jul. 22, 1976, abandoned.

[51] Int. Cl.² ............................................. H04N 5/44
[52] U.S. Cl. ................................. 358/194; 325/391; 325/392; 358/191
[58] Field of Search ................ 358/194, 191; 325/390, 325/391, 392

[56] References Cited

U.S. PATENT DOCUMENTS

| 3,052,848 | 9/1962 | Marks | 358/194 X |
| 3,266,021 | 8/1966 | Druz et al. | 358/194 X |

FOREIGN PATENT DOCUMENTS

| 231850 | 7/1958 | Australia | 358/194 |

OTHER PUBLICATIONS

Electronic Servicing, Jan. 1975, pp. 25-27.

Primary Examiner—Robert L. Richardson

[57] ABSTRACT

This invention relates to remote television channel selection and plural function apparatus comprising: A tuner for receiving a composite television signal including luminance, chrominance and audio information modulated on a carrier on any one of a plurality of channels; a demodulator connected to said tuner for providing said luminance, chrominance and audio information in a baseband format; means located at said control apparatus for manually varying the channel selection of the tuner; means located at said control apparatus for manually varying the characteristics of the baseband luminance, chrominance, and audio information as a function of viewer preference; means for remodulating and transmitting electromagnetically the composite television signal to a remotely located television receiver on an unused channel via wireless transmission; the remote control of both tuning and other receiver functions being effected without direct connection or modification to the receiver. A similar apparatus provides for remote radio channel selection for receiving radio signals. A similar apparatus provides for remote radio channel selection for receiving radio signals and means for remodulating and transmitting on an ultrasonic sound carrier. A similar apparatus provides for remote television channel selection and plural functioning in which the demodulated composite television signal is retransmitted on a carrier located in the infrared or visible range of light frequencies.

9 Claims, 10 Drawing Figures

REMOTE CONTROL

This is a continuation of the copending application of Morton Weintraub et al., Ser. No. 707,855, filed 7/22/76, and now abandoned.

BACKGROUND OF THE INVENTION

This invention relates itself to the improvement in the method of remote control by demodulation and modulation for providing information on a baseband format and for varying information and functions to remodulate and transmit the signal to a remotely located receiver without connections or modifications to the receiver and the electronic guided remote control device and apparatuses employable with the same.

DESCRIPTION OF PRIOR ART

To understand more fully the vast improvement inherent in the innovative method of remote control by means of demodulating and modulating carrier waves, it behooves us to elucidate the basic theory and features of remote control methods found in prior art and compare the prior art methods with the improved method. Though the various methods may vary somewhat, one basic underlying theory is common to all and that theory relates to the following: The implementation of remote control of a device's functions by moving or changing specific parts in the device's receiver; different control parts are required to be built into specific components of the television to enable the user to exercise remote control on every other function of the television such as volume control, contrast, color intensity or mixings. Operating in accordance with this prior art theory for remote control, the current methods of remote control could control only a television that has these control parts built in. It cannot exercise remote control on television sets of other company brands, outdated television sets or differently built television units. It cannot exercise remote control, whatever, on any television set whatever, that did not have similar control parts built in. It certainly could not control radio receivers, that did not have control parts built in.

SUMMARY OF THE INVENTION

It is therefore among the principal objects of this invention to provide an improved method of remote control that operates on the basis of demodulation and modulation of carrier waves by means of an electronic guided remote control device.

Another object of this invention is to provide an improved method of remote control that operates solely on an electronic basis without changing, adding or deleting parts, components or movements of apparatuses, devices, appliances, machinery or electronic equipment under its control, by means of an electronic guided remote control device.

Another object of this invention is to provide an improved method of remote control that exercises remote control on types, sizes, company brands of operational television systems and operational AM-FM radio systems that operate electrically or by battery power, by means of an electronic guided remote control device.

Another object of this invention is to provide an improved method of remote control that exercises remote control on AM-FM radio systems and television systems by selecting out of order the individually desired radio frequency (station) or television frequency (channel) without being required to start from the first station on AM-FM radio or from the first channel on television to go through, one by one, all the stations and channels that fall in between the first station or channel until the individually desired station or channel is arrived at for selection.

Still another object of this invention is to provide an improved method of remote control that can control any number of operational radios and any number of operational televisions simultaneously within a given area by means of an electronic guided remote control device, depending upon the power of transmission.

Yet another object of this invention is to provide an improved method of remote control that enables the transfer of the remote control device from one radio to another, from one television to another, from one electrical appliance to another, from one machine to another, from one electrical device to another without need of making modifications or corrections, internally or externally in the remote control device.

Still yet another object of this invention is to provide an electronic guided remote control device that operates without the installation of any part in the radio or television and operates in accordance with the improved method to provide numerous means including:

(a) The means to activate and/or regulate and/or monitor and/or deactivate by remote control the entire AM-FM radio spectrum, including volume, bass, treble, midrange and fine tuning levels of any AM-FM operational radio and their entire band selection, be it electrically operated or battery powered.

(b) The means to activate and/or regulate and/or monitor and/or deactivate by remote control the entire television spectrum, including color, black and white, sound controls, and the entire channel selection of any operational television, be it electrically operated or battery powered.

(c) The means to activate and/or regulate and/or monitor and/or deactivate any electrically operated appliance attached to the E.G.R.C. "Slave Driver".

(d) The means when acting on a single unit television set to transfer by remote control to the blank empty channel, empty of sound and picture, all the means listed above in (b).

(e) The means of rendering by remote control any operational AM-FM radio, any operational television unit, interference free from the transmission of the electronic guided remote control device, by the introduction and utilization and control of subcarrier waves, each unit of E.G.R.C. device possessing a different subcarrier range, or ultrasonic sound waves each unit of E.G.R.C. device possessing a different ultrasonic sound wave.

(f) The means, when acting on a single unit AM-FM radio, to perform all the multifunctional capabilities described in (a).

Still a further object of this invention is to provide a Model 1 of an E.G.R.C. device for the remote control of AM-FM radio reception and television reception in accordance with the principles of the innovative method.

Still yet a further object of this invention is to provide a Model 2 of an E.G.R.C. device, a "Mini" E.G.R.C. that applies the innovative method of remote control via a tiny E.G.R.C. device the size of a watch or a pen or a pendant.

Still yet a further object of this invention is to provide a Model 3 of an E.G.R.C. which utilizes, introduces and controls subcarrier waves, and a Model 4 of an E.G.R.C. which utilizes, introduces and controls ultrasonic waves, in accordance with the principles of the innovative method.

Still another object of this invention is to provide a Model 6 of an E.G.R.C. that combines the circuitry and functions of Model 1, Model 3, and Model 4 described above.

It behooves us to describe step by step the external and internal operations of the various models of E.G.R.C. to understand more fully the multi-functional operations and numerous means cited in this patent application.

A Model 5, E.G.R.C. device may be constructed by combining the circuitry, electronic components and parts found in Model 1 with the electronic components and parts found in Model 3, E.G.R.C. device. This combination of circuitry and parts would enable Model 5, E.G.R.C. to carry out the same operations of remote control inherent in Model 1 and Model 3.

Describing now the external operations of Model 1, E.G.R.C. device for the control of AM-FM radio reception. The AM-FM radio receiver is plugged into a power outlet and set to ON. The volume control is set midway between minimum and maximum. Bass control, treble control, and midrange control are set to maximum. The function switch is set to FM stereo reception. The tuner is set to 108MC which connects the E.G.R.C. device by radio waves, thereby controlling any type of receiver tuned to the same frequency of the E.G.R.C., the blank station of 108MC. The AM-FM radio receiver is now ready to be controlled by remote control, via Model 1, E.G.R.C. device.

Figure 1:
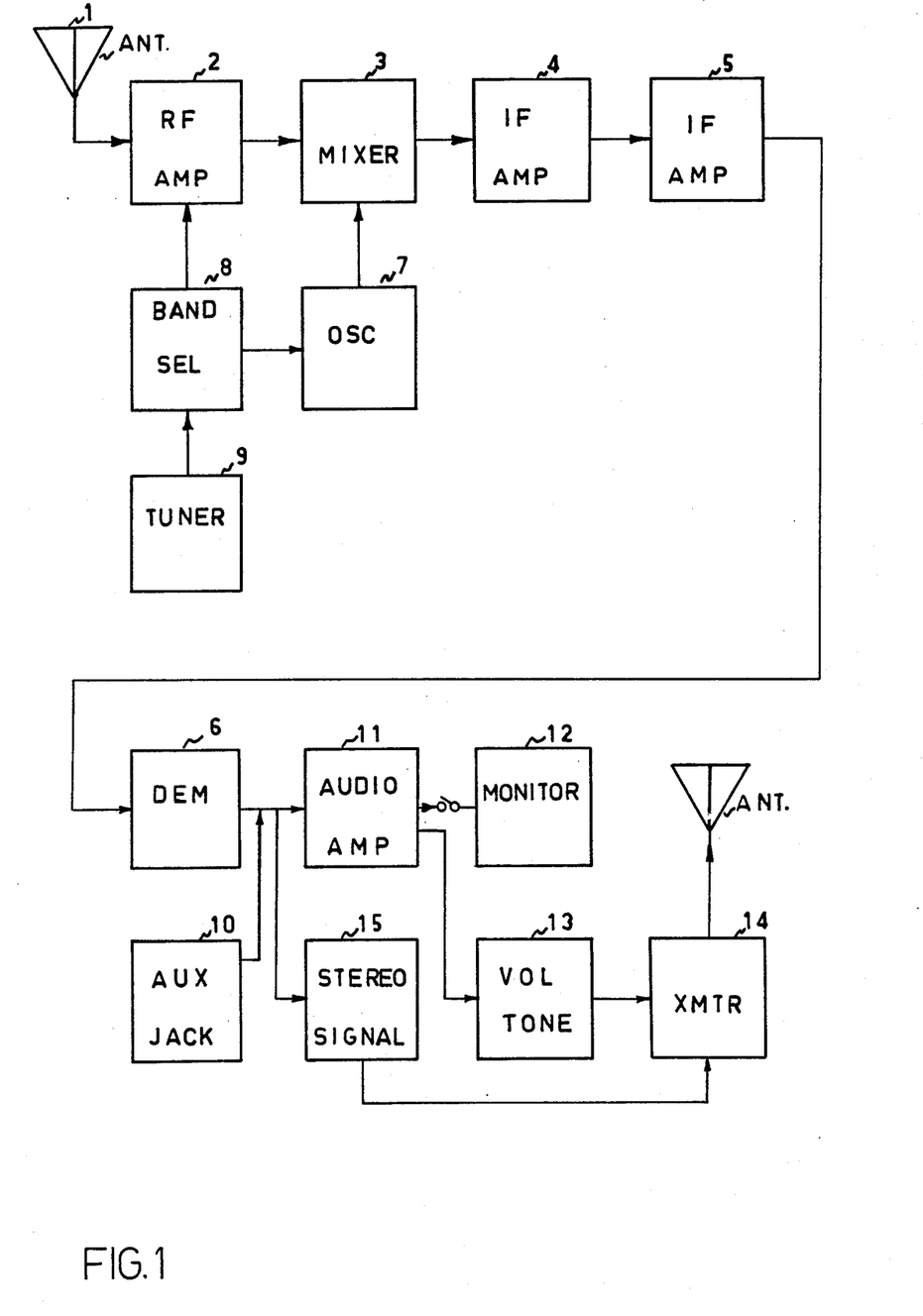
FIG. 1 is a block diagram drawing of the internal circuitry of Model 1, E.G.R.C. for the remote control of AM-FM radio reception.

Describing now the internal operation of Model 1, E.G.R.C. device for the control of AM-FM radio reception and tape recorder phonograph, microphone, and electronic instrument functioning. See FIG. (1), a block diagram drawing of the internal circuitry of Model 1, E.G.R.C. for the remote control of AM-FM radio reception.

The transmitter (14) FM 108MC, connects the E.G.R.C. through the air waves and enables the E.G.R.C. to transmit via (14) any transmitted signal-short wave or long wave- from any transmitter, Four separate controls (13) volume, bass, treble, and midrange enable the E.G.R.C. reception to be set and controlled at a selected volume, bass, treble and midrange strength. The audio amplifier (11) feeds into the volume, bass, treble and midrange control (13) and enables a degree of amplification appropriate for selected high or low intensity. The pilot stereo (15) 19KC, amplifies stereo 19KC signal and transmits it again, thereby enabling stereo reception. The demodulator (6) receives the intermediate frequency signal from (5) and demodulates it. The output of demodulator (6) is separated into two different signals consisting of a pilot frequency signal and an actual sound signal. The actual sound signal passes through the audio amplifier (11), whereby it is amplified even stronger. The amplified actual signal passes through the volume, bass, treble and midrange controls (13) and thenafter is retransmitted from transmitter (14), 108MC. The second signal, the pilot frequency 19KC from demodulator (6) passes onto the pilot stereo (15) 19KC amplifier, and thence to transmitter (14) 108MC. It is retransmitted from transmitter (14), which is tuned to the same station, 108MC, the selected empty station. Monitor (12) may be plugged in and set to ON, thereby enabling the input to the transmitter (14) to be monitored.

The tape recorder, or phonograph, or microphone, or any other electronic instrument is plugged into the auxilliary jack which automatically disconnects the E.G.R.C. receiver system control circuitry and connects the auxiliary jack input. In lieu of the receiver, the tape recorder, or phonograph or microphone, or electronic instrument is activated and implemented to be controlled remotely, via the E.G.R.C. device.

Describing now the Model 1, E.G.R.C. device remote control of operations enabling the changing of the stations in the AM-FM radio receiver. See FIG. (1) for clarification.

The AM-FM radio receiver is readied for reception in the same manner as described in the internal operation of Model 1, E.G.R.C. Antenna (1) picks up any and all signals transmitted into the airspace. The band selector (8) selects the desired AM-FM band or short wave or long wave etc. The selected band is adjusted by the tuner (9) which selects the desired station. The amplified signal is mixed by the mixer (3) in conjunction with the oscillator (7). The mixed output from the mixer (3) is fed to the intermediate frequency amplifier (4) whereby it is amplified once and then passes on to the intermediate frequency amplifier (5) whereby it is amplified a second time. The amplified signal is then passed on to the demodulator (6) which separates the radio wave carrier from the actual sound. The audio amplifier (11) receives the actual sound and passes it on to the four controls, volume, bass, treble and midrange controls (13). Thenafter, the actual sound is retransmitted by the transmitter (14) FM 108MC, and received by the AM-FM radio receiver. The monitor (12) may be plugged in and set to ON thereby enabling the input to the transmitter (14) FM 108MC to be monitored. Thus it can be seen, the E.G.R.C. device contains all the necessary controls to control remotely AM-FM reception, short wave and long wave reception. The E.G.R.C. device receives through the air all and any transmitted signals, and is enabled to transmit any and all signals received, to the selected empty station in the AM-FM radio receiver, station 108MC, a blank empty station. Also, the E.G.R.C. transmitter is enabled to transmit to any receiver and is enabled to shift from transmitting to one receiver to another receiver, regardless of the receiver's design, company make or size. The E.G.R.C. is also enabled to shift from one station to another, in the same receiver. For example: Suppose a change is made in the AM radio receiver station, and the desired station is now 80KC, the steps in the operation in changing the previous station to changed station, 80KC, are as follows: The radio receiver is readied for reception in the same manner as described in the internal operation of Model 1, E.G.R.C. The band selector is tuned from FM to AM 80KC. The tuner is set to 80KC. Thereby the receiver is capable of receiving whatever sound transmitted from station 80KC. In like manner, FM, short wave, long wave etc. can be implemented in the changing from one receiver to another. Also, in like manner a sound transmitted from a television channel can be implemented on the empty radio station, empty of sound. The E.G.R.C. transmitter may be changed to whatever frequency desired and can transmit said frequency of station or channel to the empty radio station. Any radio signal received and joined to transmitter (14) FM 108MC, can be transmitted and connected to any type of operational receiver and thereby controlled remotely by the E.G.R.C. device without the necessity of attaching, adapting or affixing anything to the exterior or interior of the operational receiver.

Figure 2:
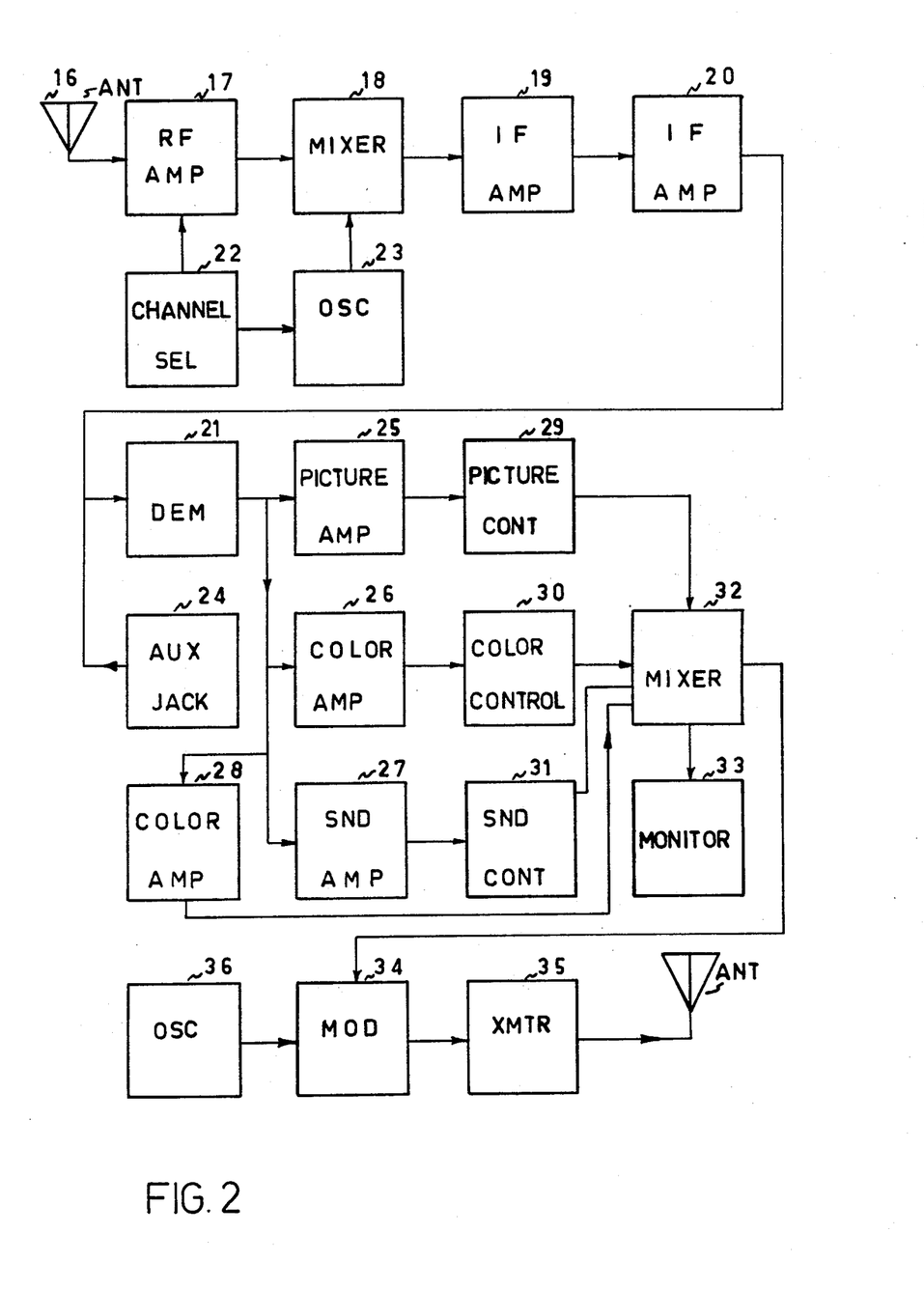
FIG. 2 is a block diagram drawing of the internal circuitry of Model 1, E.G.R.C. for the remote control of television reception.

Describing now the external operations of Model 1, E.G.R.C. device for the remote control of television reception. See FIG. (2) a block diagram drawing of a television unit remotely controlled by the E.G.R.C., for clarification.

The television unit is plugged into a power outlet. Volume control is set midway between minimum and maximum. Tuner is set to channel 12 a blank empty station, empty of both sound and picture. The television set is now enabled for television reception.

Describing now the internal operations of Model 1, E.G.R.C. device for the remote control of television reception. See FIG. (2) a block diagram drawing of the internal circuitry of Model 1, E.G.R.C. device for clarification.

Transmitter (35) 204MC, carrier amplitude modulated is capable of transmitting any signal received, sound, picture or color, onto channel 12, a selected empty station. Transmitter (35) 204MC, ties the television reception means to the E.G.R.C. device through the air waves and transmits received signals, whatever they may be, to the operational television set. Transmitter (35) 204MC transmits the signals. Oscillator (23) 204MC produces the carrier waves for transmitter (35) 204MC, which is intercepted by modulator (34) and is modulated by modulator (34). The modulated signals are fed into transmitter (35) 204MC, which transmits the modulated signals through the air. The E.G.R.C. device is now enabled to receive and transmit any signal, sound, picture and color, from any television channel, from channel 2 through channel 83, the entire television spectrum.

This is how the remote control operates. Antenna (16) receives all the signals, sound, picture, and color from television channels 2 through 83. Channel selector (22) selects the selected channel. The ratio frequency amplifier (17) amplifies the signals selected from the selected channel. The amplified signals pass into the mixer (18) which in conjunction with the oscillator (23) mixes the signals and produces an intermediate frequency signal. The intermediate frequency signal passes into the intermediate frequency amplifier (19) whereby it is amplified. Then it passes into intermediate frequency amplifier (20) where it is amplified a second time. Thereafter the amplified intermediate frequency signal passes through the demodulator (21) whereby the radio frequency carrier is separated from the video-audio-color signal. The three different signals, sound, picture and color, are amplified by their respective amplifiers. The sound amplifier (27) receives the sound signal 4.5MC and amplifies it; the picture amplifier (25) receives the picture signal 0-4MC and amplifies it; the color amplifiers (26) and (28) receive the color signal 3.8MC subcarrier and all other color signals and amplify them. The amplified color signals pass on to control (30) a separate color control; the amplified picture signals pass on to control (29) a separate picture control; the amplified sound signals pass on to control (31) a separate sound control. Control (29) controls picture intensity and contrast; control (30) controls color shading and pigment; control (31) controls sound volume. From controls (29) (30) (31) the signals pass into the mixer (32), where all the signals, color, picture and sound are mixed together to form a single signal. The single signal passes through modulator (34) whereby it is amplitude modulated and fed into transmitter (35) 204MC, which transmits it. Thus the picture, color, and sound are remotely controlled by the E.G.R.C. device. The auxiliary jack is (24). Monitor (33) may be plugged in and set to ON, thereby enabling the output from the transmitter (35) to be monitored.

Figure 3:
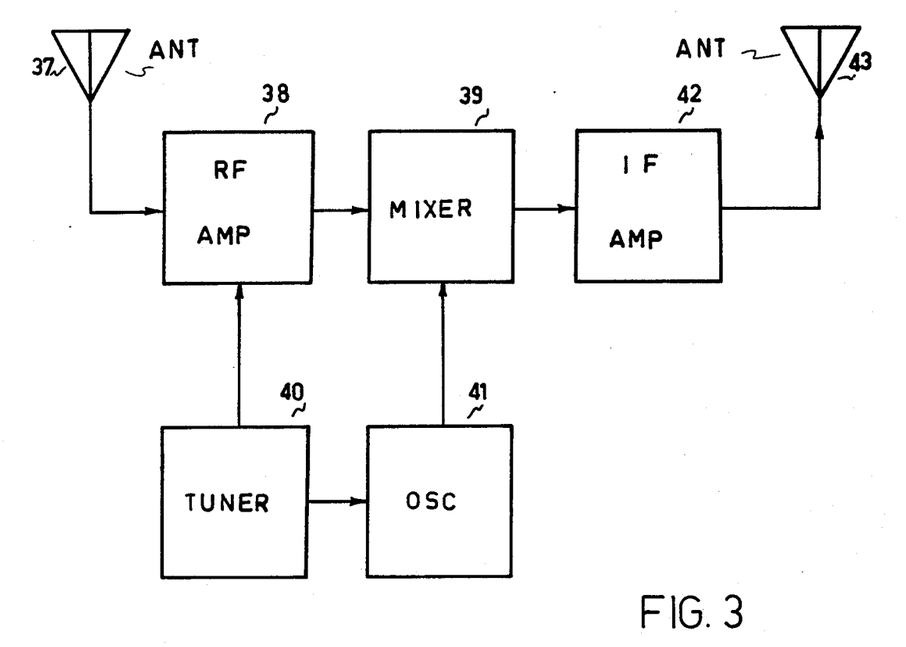
FIG. 3 is a block diagram drawing of the internal circuitry of Model 2, E.G.R.C. for the remote control of AM-FM radio reception.

Model 2, E.G.R.C. device, "Mini" E.G.R.C. for remote control of AM-FM radio reception is an application of the innovative method of remote control via an E.G.R.C. device the size of a watch or a pen or a pendant or any other similar tiny sized object. See FIG. (3) a block diagram drawing of an AM-FM radio receiver remotely controlled by Model 2—"Mini" E.G.R.C. for clarification. Describing now the internal operations of Model 2 E.G.R.C. device. Antenna (37) receives any transmitted signal, short wave or long wave, from any operating transmitter. Tuner (40) tunes radio frequency amplifier (38) and oscillator (41) to select the desired station and sets said station. Mixer (39) in conjunction with oscillator (41) mixes radio frequency signal passed from radio frequency amplifier (38) to produce an intermediate signal. The intermediate frequency signal 108MC, passes to intermediate frequency amplifier (42). The 108MC is selected as the intermediate frequency signal, as 108MC is a blank empty station, empty of sound. Any other blank station and its related frequency would also serve the same purpose and therefore could also be used. Intermediate frequency amplifier (42) amplifies the intermediate frequency signal 108MC. Thereafter, it is fed to antenna (43) 108MC output, which sends the amplified signal into the air space of the surrounding area. Thence the amplified signal enters the AM-FM receiver tuned to 108MC.

Figure 4:
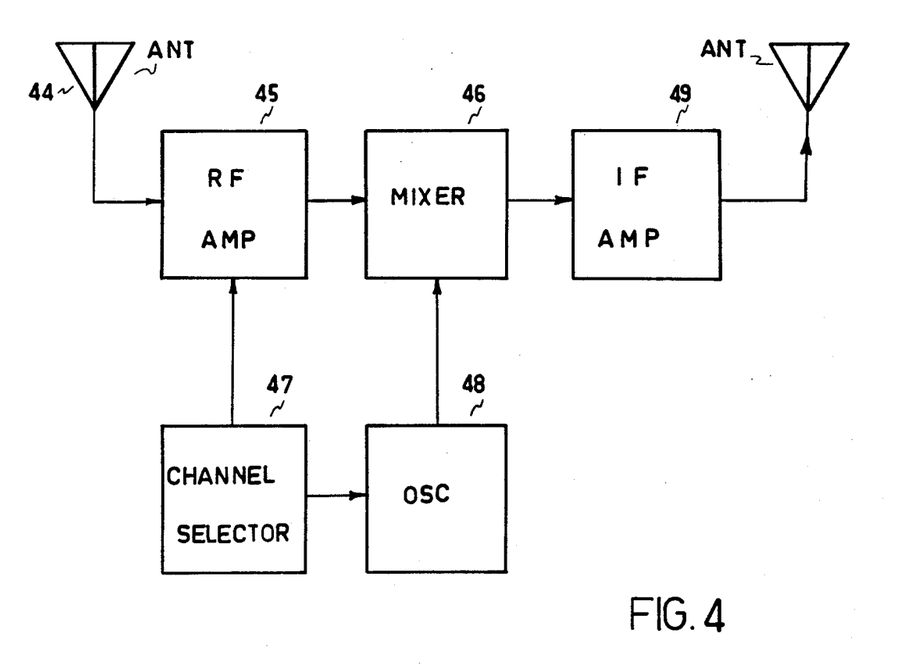
FIG. 4 is a block diagram drawing of the internal circuitry of Model 2, E.G.R.C. for the remote control of television reception.

In Model 2, "Mini" E.G.R.C. device for remote control of AM-FM radio reception, additional circuitry and electronic components can be added on, within the tiny space of the watch, pen, or pendant to provide remote control means and functions for television reception. See FIG. (4) a block diagram drawing of Model 2 containing additional circuitry and electronic components for remote control of television reception. This is how the remote control of television reception by Model 2, "Mini" E.G.R.C. device operates: Antenna (44) receives all the signals, sound, picture color, from television channels 2 through 83, Channel selector (47) selects the selected channel. The radio frequency amplifier (45) amplifies the signals selected from the selected channel. The radio frequency amplifier (45) amplifies the signals selected from the selected channel. The channel selector (47) sets the radio frequency amplifier (45) and also oscillator (48), to enable the two signals to be mixed by the mixer (46), in conjunction with the oscillator (48) to produce an intermediate frequency signal, of 204MC, which is the same frequency of channel 12, an empty channel, empty of both sound and picture. The new intermediate frequency signal, of 204MC, passes on to the intermediate frequency amplifier (49), whereby it is amplified and acts as a transmitter for channel 12. Thus the sound, picture and color are changed by the E.G.R.C. device.

This tiny E.G.R.C. may control an unlimited number of radios and television units in a given area, depending upon the power output of the intermediate frequency. Model 2, E.G.R.C. operates on the basis of mixing frequency signals.

Figure 5:
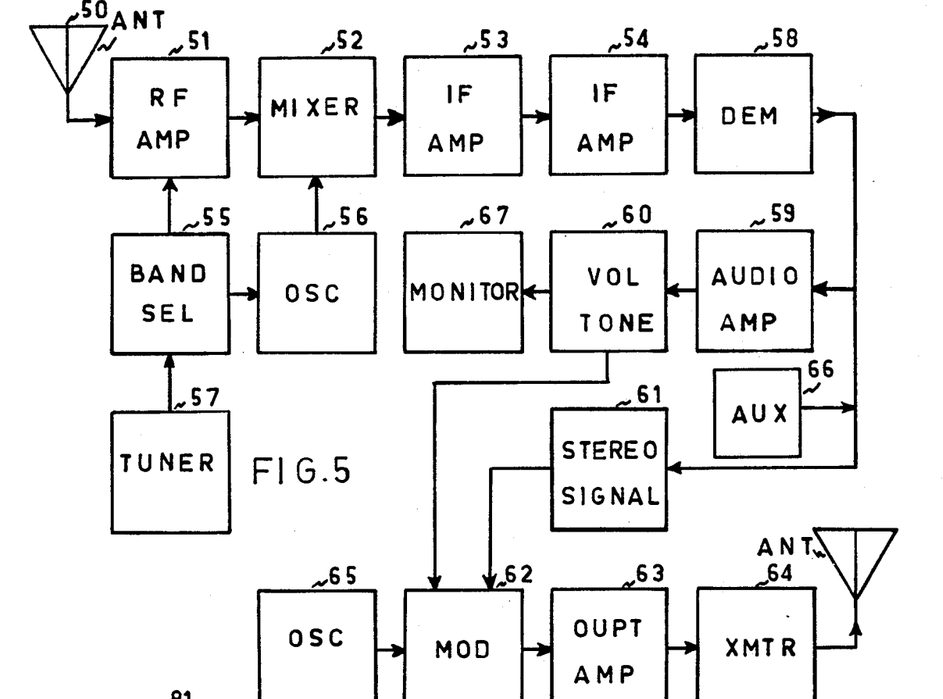
FIG. 5 is a block diagram drawing of the internal circuitry of Model 3, E.G.R.C. utilizing a "Slave Driver" and a "Slave Receiver" for the remote control of AM-FM radio reception.
Figure 6:
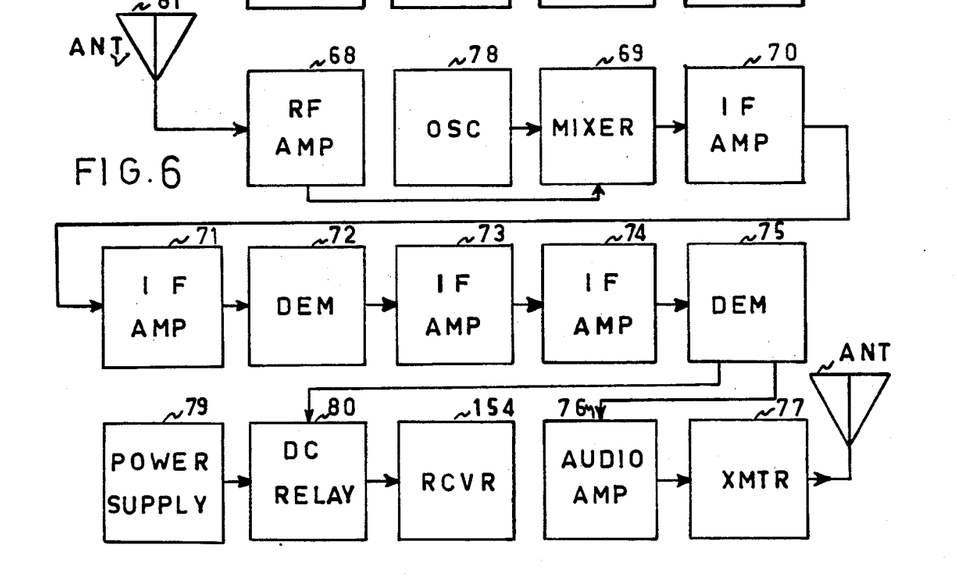
FIG. 6 is a block diagram drawing of the internal circuitry of the "Slave Driver", Model 3, E.G.R.C. in subcarrier application.

Now describing the external operation of Model 3, E.G.R.C. device on AM-FM radio reception, utilizing a "Slave Driver" and a "Slave Receiver", the AM-FM radio receiver, in the application of subcarrier waves for electronic remote control. See FIGS. (5&6) a block drawing of a radio receiver remotely controlled by Model 3, E.G.R.C. device, for clarification.

The AM-FM receiver is plugged into an OFF-ON relay switch (80) which said relay switch (80) is plugged into a wall outlet (79), and turns the receiver ON. The power outlet (79) is remotely controlled by the "Slave Driver" which in turn is remotely controlled by the Model 3, E.G.R.C. device. The "Slave Driver" may be placed anywhere within a foot's distance from the AM-FM receiver or may be placed on top of it. Volume control is set midway between minimum and maximum. Bass control, treble control and midrange controls are set to maximum. Band selector is set to FM. Tuner is set to 108MC, which connects the E.G.R.C. device by radio waves, thereby controlling the AM-FM radio receiver tuned to the same frequency of the E.G.R.C. device, 108MC. Now that all the necessary preliminary adjustments are made, no further adjustments are required for any of the AM-FM radio components or for the "Slave Driver". All the following proceedings are implemented by the manipulation of the E.G.R.C. device. The "Slave Receiver", the AM-FM radio receiver, is mastered or rather driven by the "Slave Driver".

Describing now the internal operation of Model 3, E.G.R.C. device for AM-FM radio reception utilizing a "Slave Driver " and a "Slave Receiver", radio receiver, in the application of subcarrier waves for electronic guided remote control. See FIG. (5) a block diagram drawing of the circuitry of Model 3, E.G.R.C. device utilizing a "Slave Driver" and a "Slave Receiver", radio receiver, for clarification.

Antenna (50) which is a combined AM rod antenna and a FM stick antenna, picks up any and all signals transmitted into the air waves and passes the signal to radio frequency amplifier (51). Band selector (55) selects the desired band, AM or FM or short wave or long wave etc. The selected band is adjusted by the tuner (57) which selects the desired station. Radio frequency amplifier (51) amplifies the desired signal. The desired radio frequency signal is fed into mixer (52) which mixes the signal in conjunction with the oscillator (56). The mixed output of either an intermediate frequency of 10.7 for FM radio reception, 55.4 for AM radio reception, is passed on to the intermediate frequency amplifier (53) where it is amplified once. It is then passed on to intermediate frequency amplifier (54) where it is amplified a a second time. It then passes on to demodulator (58) where it is demodulated, thereby removing the actual sound from the frequency carrier. The actual sound, AM, passes to audio amplifier (59) where it is amplified even stronger. Thence the amplified sound passes on to four controls (60) volume, bass, treble and midrange. The output signal from the controls (60) is fed to modulator (62) thereby in conjunction with oscillator (65) it is amplitude modulated to form subcarrier 200KC. The modulator (62) output is fed to output amplifier (63) which amplifies and powers the modulated signal from modulator (62) thereby modulating the main transmitter (64) 150MC frequency modulated. The main transmitter (64) 150MC frequency, is frequency modulated by the actual sound. Output amplifier (63) which was fed to transmitter (64) 150MC frequency modulated, is now transmitted into the air space. In FM stereo reception, in addition to the above components and related steps, an amplifier (61) with its related steps are included, as follows: Amplifier (61) a 19KC, amplifies the subcarrier's pilot, a 19KC frequency, thereby enabling the Model 3, E.G.R.C. device, to transmit stereo reception from any stereo station. The L-R signal, carried by the 38KC subcarrier of FM stereo, is amplified by audio amplifier (59). Audio amplifier (59) is so designated as to pass signals up to 45KC or more, enables the L-R, 38KC, to pass with its regular sound. Following the amplification of these two signals, 19KC and 38KC, the full beauty of stereo reception is transmitted via a Model 3, E.G.R.C. device. The auxilliary jack is (66) and the monitor is (67).

Describing now the utilization of a "Slave Driver" in the application of the subcarrier waves for electronic guided remote control. See FIG. (6) a block diagram drawing of the internal circuitry of a Model 3, E.G.R.C. device, "Slave Driver", for clarification.

The primary function of a slave driver is to receive, demodulate modulate and retransmit the actual sound matching to the frequency of the radio receiver. This function is carried out as follows: Antenna (81) receives the 150MC output sent through the air space, via the E.G.R.C. device. Antenna (81) passes it on to radio frequency amplifier (68) which is tuned to receive only 150MC frequency. The signal output from the radio frequency amplifier (68) passes on to mixer (69) 150MC, which in conjunction with oscillator (78) 139.3MC, mixes the signal, thereby producing a new signal, intermediate frequency 10.7MC. Intermediate frequency amplifier (70) 10.7MC, amplifies and strengthens this new signal. The new signal passes on to intermediate frequency amplifier (71) which amplifies it even stronger. The output signal from the intermediate frequency amplifier (71) passes into demodulator (72) which demodulates it, thereby separating the main carrier, the original 150MC, from the subcarrier. Intermediate frequency amplifier (73) amplifies the 200KC a subcarrier which is distinctly different from subcarriers used in close proximity to one another, other E.G.R.C. devices, thereby preventing interference in reception. The subcarrier 200KC passes on to intermediate frequency amplifier (74) 200KC, which amplifies the subcarrier output even more. The amplified subcarrier passes into demodulator (75), which demodulates it, thereby separating the subcarrier from the actual sound. Now the demodulator (75) passes out two signals, one is the DC of the demodulated 200KC intermediate frequency amplifier. The demodulated DC is utilized as a pilot to open or close the AM-FM radio receiver. Pilot DC voltage is first amplified by DC amplifier (not shown) from thence it passes on to the DC relay (80) which opens or closes. If power is present in the 200KC demodulator, the relay turns to OFF, as there is an absence of a power supply to operate it. As can be seen, the operation of 200KC depends on the E.G.R.C. transmitter. When E.G.R.C. is turned to OFF, the absence of the 200KC that follows automatically, turns OFF the AM-FM radio receiver. When the E.G.R.C. is turned to ON, the presence of the transmitted 200KC, automatically turns on the main receiver as described above. The second signal that passes out from the demodulator (75) is the complete sound in addition to the stereo transmission with all of its associated signals. In AM reception the second signal is fed into the audio amplifier (76) which amplifies sufficiently the audio signal to drive the "Slave Driver's" transmitter (77). Transmitter (77) transmits the complete amplified signal the output of audio amplifier (76) which contains AM or Stereo FM, or sounds from a microphone or from adapted equipment. The output from transmitter (77) is sent into the limited air space, one foot or less from the transmitter (77) thereby preventing any interference with other AM or FM receivers. The transmitted completed amplified signal is received by the "Slave Receiver" which is tuned to the same frequency as the "Slave Driver" 108MC. Auxilliary jack (not shown) may be used as an antenna output from the "Slave Driver" to drive numerous receivers by connecting a wire into the auxiliary jack, extending and overlapping the wire over the receivers; the receivers come directly under the remote control of the E.G.R.C. device.

Figure 7:
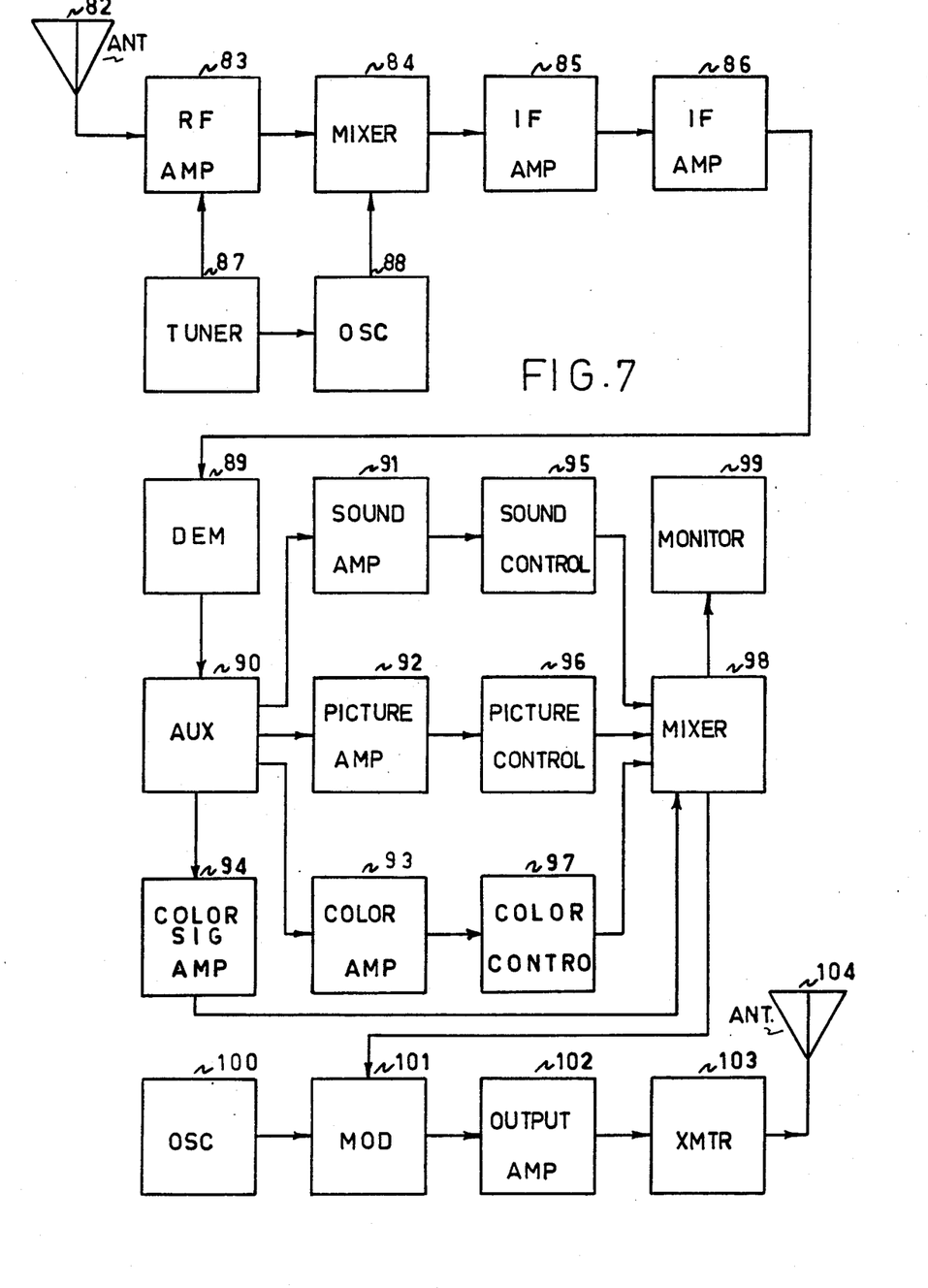
FIG. 7 is a block diagram drawing of the internal circuitry of Model 3, E.G.R.C. utilizing a "Slave Driver" and a "Slave Receiver" for the remote control of television reception.
Figure 8:
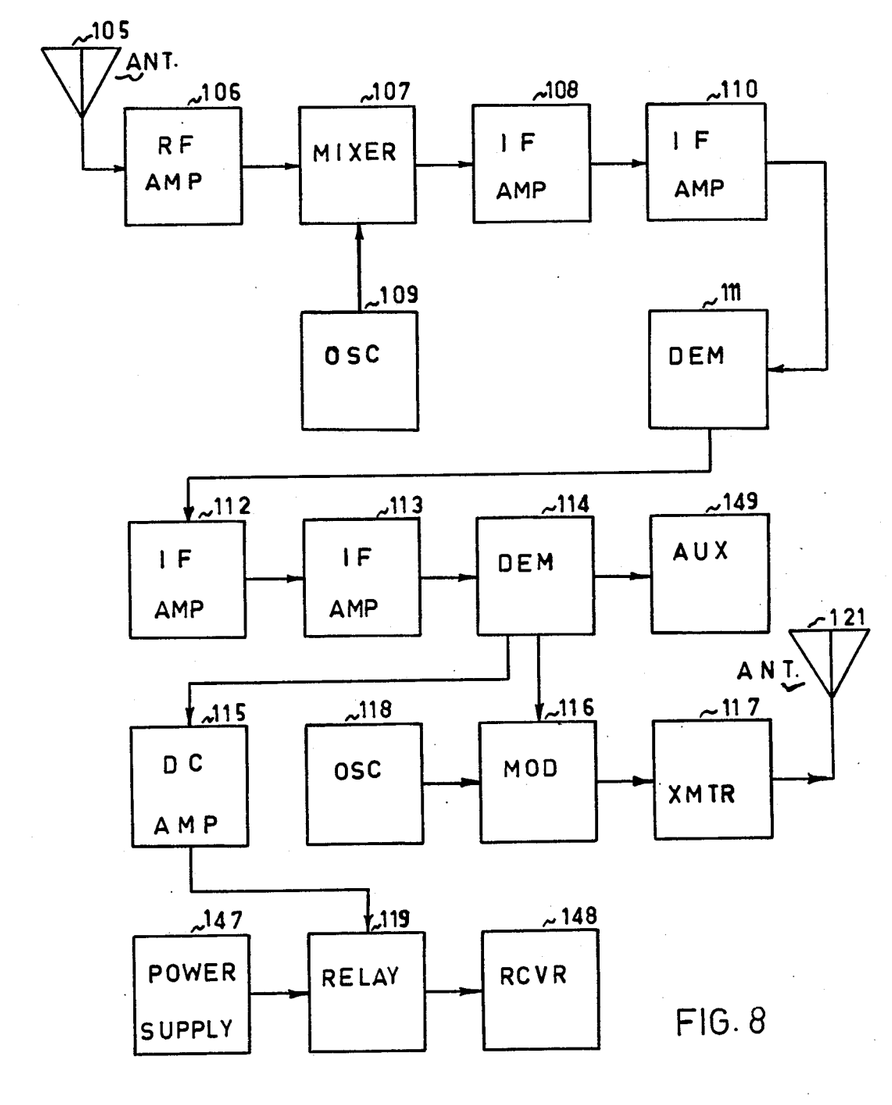
FIG. 8 is a block diagram drawing of the internal circuitry of the "Slave Driver", Model 3, E.G.R.C. in subcarrier application.

Describing now the external operations of Model 3, E.G.R.C. device for television reception utilizing a "Slave Driver" and a "Slave Receiver", a television receiver, in the application of subcarrier waves for electronic guided remote control. See FIGS. (7&8) for clarification.

The television cord is plugged into ON and OFF relay switch (119), which said relay switch (119) is plugged into a wall outlet. If the television receiver is battery driven, the relay switch (119) can be adapted to its use as an ON and OFF switch. The volume control may be set midway between minimum and maximum. The tuner may be set to channel 12, an empty blank channel, empty of both sound and picture. The television unit is now ready for reception. No further manipulation of dials or television components are required. All sound reception and picture reception from the television set can be activated, implemented, and deactivated now by means of the Model 3, E.G.R.C. device in remote control operations.

Describing now the internal operations of Model 3, E.G.R.C. device for television reception utilizing a "Slave Driver" and a "Slave Receiver", a television receiver, in the application of the subcarrier waves for electronic guided remote control. See FIG. (7), a block diagram drawing of the internal circuitry of Model 3, E.G.R.C. for clarification.

Antenna (82) picks up all the transmitted television channels and feeds them to radio frequency amplifier (83). The radio frequency amplifier (83) amplifies the selected signal which was selected by tuner (87) and oscillator (88), thereby selecting only one of the many stations and rejecting all others. From radio frequency amplifier (83) the signal is fed to mixer (84), which in conjunction with the oscillator (88) produces a new intermediate frequency signal. The new signal is passed on to the intermediate frequency amplifier (85) which amplifies it. The amplified intermediate frequency signal is passed on to intermediate frequency amplifier (86) which amplifies the signal a second time. The amplified signal is then passed on to demodulator (89), where the audio and video signals are passed through auxilliary jack (90). From (90) the signals are passed to four different amplifiers (91), (92), (93) and (94). The 4.5 MC sound carrier is amplified by sound amplifier (91). The picture carrier 0–4 MC is amplified by the picture amplifier (92). The 3.8 MC color carrier is amplified by color amplifier (93). All associate color signals are amplified by color signal amplifier (94). The signals, outputs from (91), (92) and (93), are passed through volume controls- sound control (95), picture control (96), and color control (97). Sound control (95) enables any level of sound to be set; picture control (96) enables any level of picture contrast to be set; color control (97) enables any level of shading to be set. The outputs of (95), (96), (97) and (94) are fed into mixer (98) where the signals- sound, color and picture, are mixed. The mixed signals are passed on to amplitude modulator (101) which in conjunction with subcarrier oscillator (100) modulates the signals to a single 10MC subcarrier signal. The modulated signal is fed to the output amplifier (102), whereby it is powered to modulate the 1000 MC FM transmitter (103). The output from transmitter (103) is sent to antenna (104) which passes it on to the air space of the surrounding area. Monitor (99) may be plugged in and set to ON, thereby enabling the output of the transmitter (103) to be monitored.

Now describing the internal operations of the "Slave Driver" and the "Slave Receiver", the television receiver. See FIG. (8) a block diagram drawing of the internal circuitry of the "Slave Driver" for clarification.

Antenna (105) picks up the 1000MC signal which is transmitted via the E.G.R.C. transmitter (103). The signal is then passed on to the radio frequency amplifier (106) which is pretuned to receive only the 1000 MC signal. Thenafter it is fed to mixer (107), 1000 MC which in conjunction with oscillator (109) 980 MC, mixes the signal to produce a 20 MC signal for the intermediate frequency amplifier stages of the operation. The 20 MC signal is passed on to intermediate frequency amplifier (108) 20MC, which amplifies it once, and thenafter fed to intermediate frequency amplifier (110) 20MC which amplifies it a second time. The intermediate frequency amplified signal is passed on to the demodulator (111) whereby the main radio carrier is separated from the subcarrier. The 10 MC subcarrier is fed to intermediate frequency amplifier (112) which amplifies the subcarrier once and thenafter passes it on to intermediate frequency amplifier (113), which amplifies it a second time. Then it is passed on to demodulator (114) which removes the audio-video signal from the subcarrier. The output from demodulator (114) consists of two signals. One signal, the audio-video signal, is passed on to the amplitude modulator (116) which in conjunction with oscillator (118) 204MC amplitude modulates the signal. Thenafter, it is fed to transmitter (117) 204MC which is the transmitter of channel 12. The signal is sent to antenna (121) which transmits it to the surrounding area, not exceeding a foot's distance from the location of the antenna (121), thereby preventing any interference from other television units operating on the same frequency. Auxilliary jack (not shown) may be used as an antenna output from the "Slave Driver" to drive numerous television receivers, by connecting a wire into the auxilliary jack and overlapping said wire over the receivers. Without plugging the wire into the receivers, the receivers would be directly under the remote control of the E.G.R.C. device. The second signal of demodulator (114) output is a DC level signal, which is utilized to turn the television receiver ON or OFF, by remote control. The DC level of the output of demodulator (114) which originates from the subcarrier 10 MC signal is amplified by DC amplifier (115) thereby empowering relay switch to turn on the television receiver. When the E.G.R.C. device is turned OFF the subcarrier signal 10 MC disappears, thereby causing a loss in the DC level which automatically releases the relay switch (119). Relay switch (119) is plugged into power source (147) and (119) is connected to television receiver (148). When the relay switch (119) is released the television is turned OFF.

Figure 9:
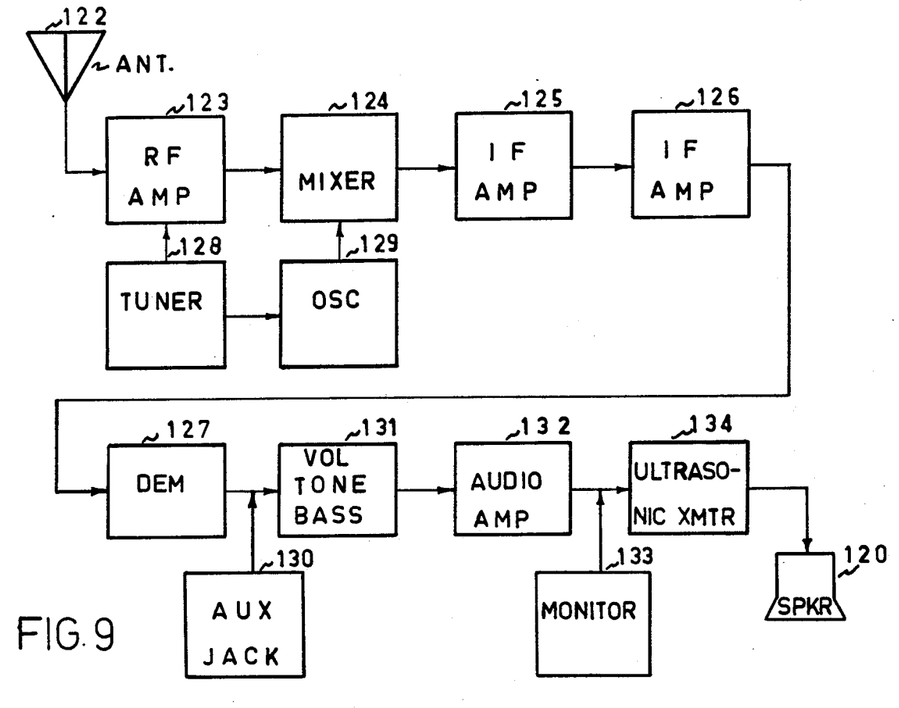
FIG. 9 is a block diagram drawing of the internal circuitry of Model 4, E.G.R.C. device for the adaptation of ultrasonic sound for remote control of AM-FM radio reception.

Describing now the external operations of Model 4, E.G.R.C. device for the adaptation of ultrasonic sound for remote control of AM-FM radio via the E.G.R.C. device. See FIG. (9) a block diagram drawing of the AM-FM radio receiver under the remote control of Model 4, E.G.R.C. device, for clarification.

Figure 10:
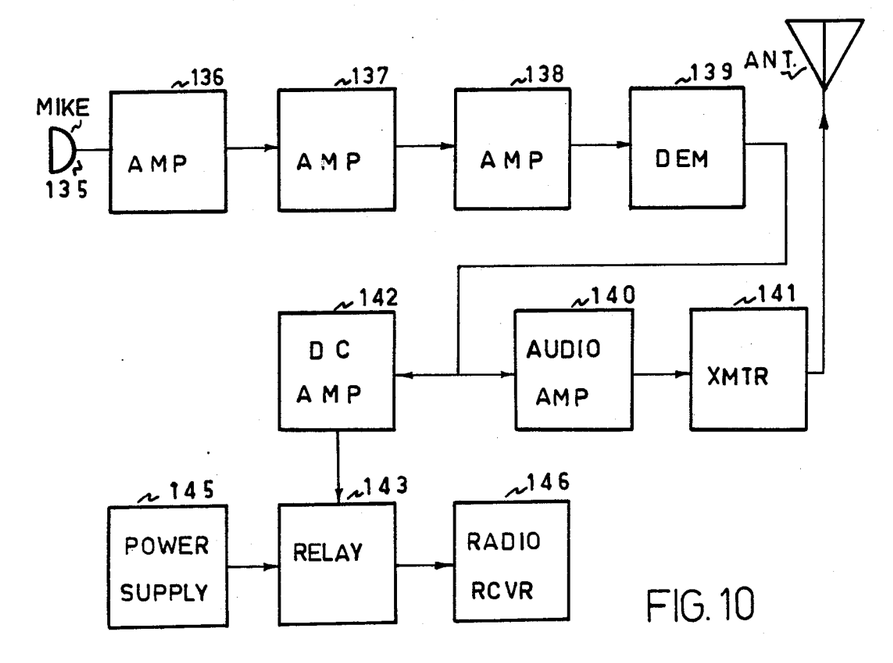
FIG. 10 is a block diagram drawing of the internal circuitry of Model 4, E.G.R.C. device for the remote control of an AM-FM radio receiver.

Antenna (122) picks up all the radio station signals and feeds them to radio frequency amplifier (123). Radio frequency amplifier (123) amplifies the selected station, selected by tuner (128) in conjunction with oscillator (129). Mixer (124) mixes the signal, whereby a new intermediate frequency signal is produced. Intermediate frequency amplifier (125) amplifies the signal once and feeds it to the intermediate frequency amplifier (126) where it is amplified a second time. The signal is passed on to the demodulator (127) which separates the intermediate frequency signal from the actual sound. The output of demodulator (128) passes on to volume control (131), which sets the volume level and controls the output to volume controls, which said controls respectively adjust the bass, treble and midrange. Thenafter the signal is fed to audio amplifier (132) which amplifies the actual sound. The amplified actual sound is fed to the ultrasonic transmitter (134) 25KC which transmits through the air-space in the form of ultrasonic waves 25KC. Monitor (133) may be plugged in and set to ON, thereby enabling the output from the transmitter (134) 25KC to be monitored. As the ultrasonic sound fills the air space it carries with it remotely and wirelessly the complete actual sound to the surrounding air space. Auxilliary jack is (130). See FIG. (10) a block diagram drawing of an AM-FM radio receiver under the remote control of Model 4, E.G.R.C. device, for clarification.

Microphone (135) picks up the ultrasonic waves 25KC and feeds them to intermediate frequency amplifier (136) 25KC. The intermediate frequency amplifier (136) 25KC, amplifies the ultrasonic waves and thenafter passes them on to intermediate frequency amplifier (137) 25KC where they are amplified a second time. Thence it is passed on to intermediate frequency amplifier (138) where it is amplified even more, a third time. Demodulator (139) separates the 25KC ultrasonic carrier from the actual sound, thereby producing a DC signal for relay switch (143) which said relay switch (143) is plugged into a wall outlet and turns the receiver ON. Audio amplifier (140) amplifies the actual sound and thenafter feeds the amplified actual sound to transmitter (141) 108MC FM, which transforms the actual sound again to a radio wave. The radio wave is received by the AM-FM radio receiver, tuned to the same frequency 108MC. The DC amplifier (142) amplifies the DC output of pilot signal from the demodulator (139) sufficiently enough to activate relay switch (143). The power supply is (144). The radio receiver is (145).

Likewise, a Model 6, E.G.R.C. device may be constructed in such a manner that it contains the features or functions to carry out the operations of remote control inherent in Model 1, Model 3, Model 4 and Model 5 in a single unit "Master Model" E.G.R.C. device.

It is understood that the form, implementation and adaptation of the invention herewith described is to be taken as an illustrative embodiment only of the same, and that various procedural changes may be resorted to without departing from the spirit of the invention.

We claim:

1. Remote television channel selection and plural function control apparatus comprising:
   a. A tuner for receiving a composite television signal including luminance, chrominance and audio information modulated on a carrier on any one of a plurality of channels;
   b. a demodulator connected to said tuner for providing said luminance, chrominance and audio information in a baseband format;
   c. means located at said control apparatus for manually varying the channel selection of the tuner,
   d. means located at said control apparatus for manually varying the characteristics of the baseband luminance, chrominance and audio information as a function of viewer preference,
   e. means for remodulating and transmitting electromagnetically the composite television signal to a remotely located television receiver on an unused channel via wireless transmission; and,
   f. the remote control of both tuning and other receiver functions being effected without direct connection or modification to the receiver.

2. The apparatus of claim 1 wherein the retransmitted composite television signal is closely coupled to the television receiver being controlled in order to overide a channel in use.

3. The apparatus of claim 1 wherein the remote control means controls a relay switch means at the television receiver for switching A.C. power to the television receiver and/or other household appliances.

4. The apparatus of claim 1 in which the demodulated composite television signal is retransmitted on a carrier located in the infra-red or visible range of light frequencies.

5. Remote radio channel selection and plural function control apparatus comprising:

a. A tuner for receiving a radio signal including audio information modulated on a carrier on any one of a plurality of channels;
b. a demodulator connected to said tuner for providing said audio information in a baseband format;
c. means located at said control apparatus for manually varying the channel selection of the tuner;
d. means located at said control apparatus for manually varying the characteristics of the baseband audio information as a function of listener preference;
e. means for remodulating and transmitting electromagnetically the audio signal to a remotely located radio receiver on an unused channel via wireless transmission; and,
f. the remote control of both tuning and other receiver functions being effected without direct connection or modification to the receiver.

6. The apparatus of claim 5 wherein the remote control means controls a relay switch means at the radio receiver for switching A.C. power to the radio receiver and/or other household appliances.

7. The apparatus of claim 5 in which the demodulated audio signal is retransmitted on a carrier located in the infra-red or visible range of light frequencies.

8. Remote radio channel selection and plural function control apparatus comprising:
a. A tuner for receiving a radio signal including audio information modulated on a carrier on any one of a plurality of channels;
b. a demodulator connected to said tuner for providing said audio information in a baseband format;
c. means located at said control apparatus for manually varying the channel selection of the tuner;
d. means located at said control apparatus for manually varying the characteristics of the baseband audio information as a function of listener preference;
e. means for remodulating and transmitting on an ultrasonic sound carrier the audio signal to a remotely located radio receiver on an unused channel via wireless transmission; and,
f. the remote control of both tuning and other receiver functions being effected without direct connection or modification to the receiver.

9. The apparatus of claim 8 wherein the remote control means controls a relay switch means at the radio receiver for switching A.C. power to the radio receiver and/or other household appliances.

* * * * *